(12) United States Patent
Chan et al.

(10) Patent No.: US 8,576,655 B2
(45) Date of Patent: Nov. 5, 2013

(54) SEMICONDUCTOR MEMORIES

(75) Inventors: Wei Min Chan, Sindian (TW);
Yen-Huei Chen, Jhudong Township (TW); Jihi-Yu Lin, Taichung (TW); Hsien-Yu Pan, Hsinchu (TW); Hung-Jen Liao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 301 days.

(21) Appl. No.: 13/164,807

(22) Filed: Jun. 21, 2011

(65) Prior Publication Data

US 2012/0327704 A1     Dec. 27, 2012

(51) Int. Cl.
*G11C 8/00*     (2006.01)

(52) U.S. Cl.
USPC .................. 365/230.04; 365/154; 365/189.05

(58) Field of Classification Search
USPC ................................ 365/230.04, 154, 189.05
See application file for complete search history.

(56) References Cited

U.S. PATENT DOCUMENTS

| | | | |
|---|---|---|---|
| 5,805,506 A * | 9/1998 | Matsui | 365/189.05 |
| 6,005,796 A | 12/1999 | Sywyk et al. | |
| 6,239,458 B1 | 5/2001 | Liaw et al. | |
| 6,380,024 B1 | 4/2002 | Liaw | |
| 6,417,032 B1 | 7/2002 | Liaw | |
| 6,535,453 B2 | 3/2003 | Nii et al. | |
| 6,569,723 B2 | 5/2003 | Liaw | |
| 6,649,456 B1 | 11/2003 | Liaw | |
| 6,693,820 B2 | 2/2004 | Nii et al. | |
| 6,738,305 B1 | 5/2004 | Liaw | |
| 6,812,574 B2 | 11/2004 | Tomita et al. | |
| 6,891,745 B2 | 5/2005 | Liaw | |
| 6,909,135 B2 | 6/2005 | Nii et al. | |
| 6,975,531 B2 | 12/2005 | Forbes | |
| 6,977,837 B2 | 12/2005 | Watanabe et al. | |
| 7,038,926 B2 | 5/2006 | Jeong et al. | |
| 7,236,396 B2 | 6/2007 | Houston et al. | |
| 7,525,868 B2 | 4/2009 | Liaw | |
| 7,606,061 B2 | 10/2009 | Kengeri et al. | |

(Continued)

OTHER PUBLICATIONS

Wu, J.J. et al., "A Large σV TH/VDD Tolerant Zigzag 8T SRAM with Area-Efficient Decoupled Differential Sensing and Fast Write-Back Scheme", Symposium on VLSI Circuits/Technical Digest of Technical Papers, 2010, pp. 103-104.

(Continued)

*Primary Examiner* — Son Dinh
*Assistant Examiner* — Nam Nguyen
(74) *Attorney, Agent, or Firm* — Duane Morris LLP

(57) ABSTRACT

A semiconductor memory includes a bit cell having first and inverters forming a latch. First and second transistors are respectively coupled to first and second storage nodes of the latch and to first and second write bit lines. Each of the first and second transistors has a respective gate coupled to a first node. Third and fourth transistors are coupled together in series at the first node and are disposed between a write word line and a first voltage source. Each of the first and second transistors has a respective gate coupled to a first control line. A fifth transistor has a source coupled to a second voltage source, a drain coupled to at least one of the inverters of the latch, and a gate coupled to the first node. A read port is coupled to a first read bit line and to the second storage node of the latch.

20 Claims, 13 Drawing Sheets

(56) References Cited

U.S. PATENT DOCUMENTS

| | | |
|---|---|---|
| 7,738,282 B2 | 6/2010 | Liaw |
| 2002/0127786 A1 | 9/2002 | Liaw |
| 2004/0076071 A1 | 4/2004 | Liaw |
| 2004/0090818 A1 | 5/2004 | Liaw |
| 2005/0253287 A1 | 11/2005 | Liaw |
| 2007/0025132 A1 | 2/2007 | Liaw |
| 2008/0197419 A1 | 8/2008 | Liaw |
| 2009/0040858 A1 | 2/2009 | Kengeri et al. |
| 2010/0124099 A1 | 5/2010 | Wu et al. |
| 2011/0026308 A1 | 2/2011 | Liaw |
| 2012/0195105 A1 | 8/2012 | Wang |

OTHER PUBLICATIONS

Nii, K. et al., "A 90 nm Dual-Port SRAM with 2.04 µm2 8T-Thin Cell Using Dynamically-Controlled Column Bias Scheme", 2004 IEEE International Solid State Circuits Conference, Feb. 15-19, 2004.

* cited by examiner

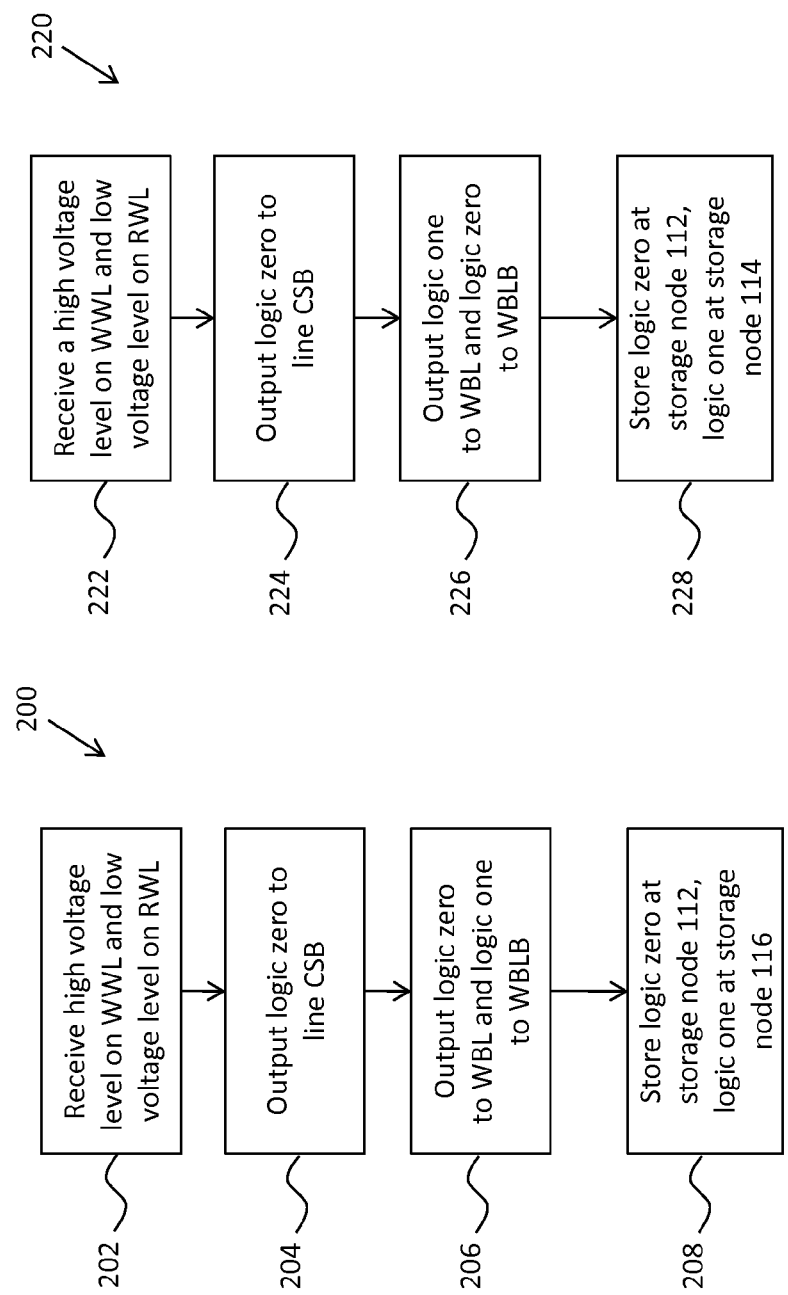

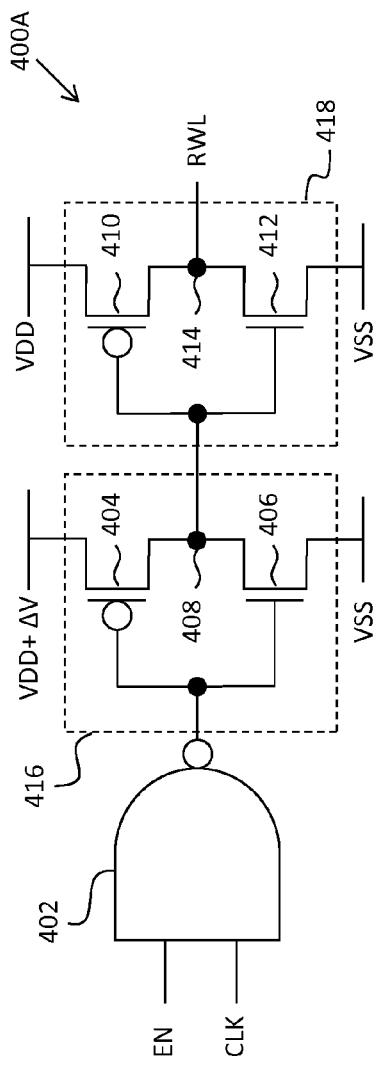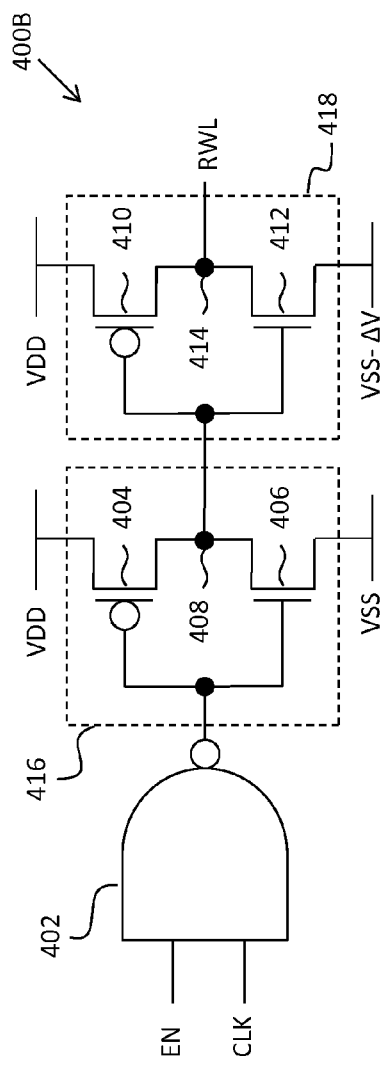
FIG. 4A
FIG. 4B

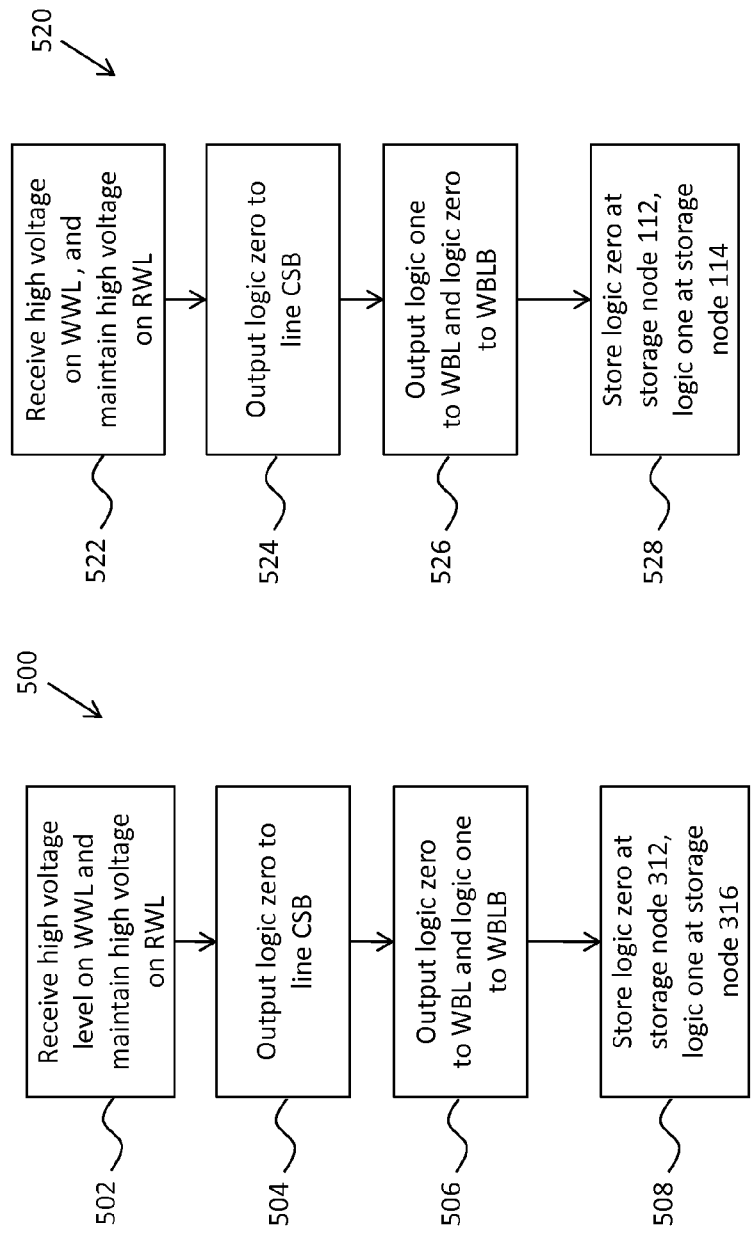

SEMICONDUCTOR MEMORIES

FIELD OF DISCLOSURE

The disclosed circuits and methods relate to integrated circuits ("ICs"). More specifically, the disclosed circuits and methods relate to IC memory devices.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. However, conventional SRAM cells suffer from half-select disturbance in which all the cells on the same row, which is controlled by a common word line, are simultaneously activated when only a cell in a single column is to be accessed (i.e., data being read from or written to the cell). The half-select disturbance may result in data corruption of the cells not being accessed due to their half-selection (i.e., the word line to which they are coupled being set to a logic "1" or "high"). Additionally, conventional SRAM cells typically exhibit poor current performance during VCCmin operation (the operation of the SRAM under the lowest possible voltage under which the SRAM may reliably be operated).

BRIEF DESCRIPTION OF THE DRAWINGS

FIG. 2A is a flow diagram of the writing operation illustrated in FIG. 1C.

FIG. 2B is a flow diagram of the writing operation illustrated in FIG. 1D.

FIG. 4A is a circuit diagram of one example of an improved read bit line driver in accordance with the differential bit cells illustrated in FIGS. 3A and 3B.

FIG. 4B is a circuit diagram of another example of an improved read bit line driver in accordance with the differential bit cells illustrated in FIGS. 3A and 3B.

FIG. 5A is a flow diagram of one example of writing a logic one to a differential bit cell in accordance with the bit cell illustrated in FIG. 3A.

FIG. 5B is a flow diagram of one example of writing a logic zero to a differential bit cell in accordance with the bit cell illustrated in FIG. 3A.

DETAILED DESCRIPTION

Improved single-ended and differential semiconductor memories are disclosed. These memories reduce and/or eliminate half-selected read line disturbance while providing improved read and write margins. The improved read and write margins advantageously increase the performance of the semiconductor memories such that faster read and write times are achieved.

Figure 1A:
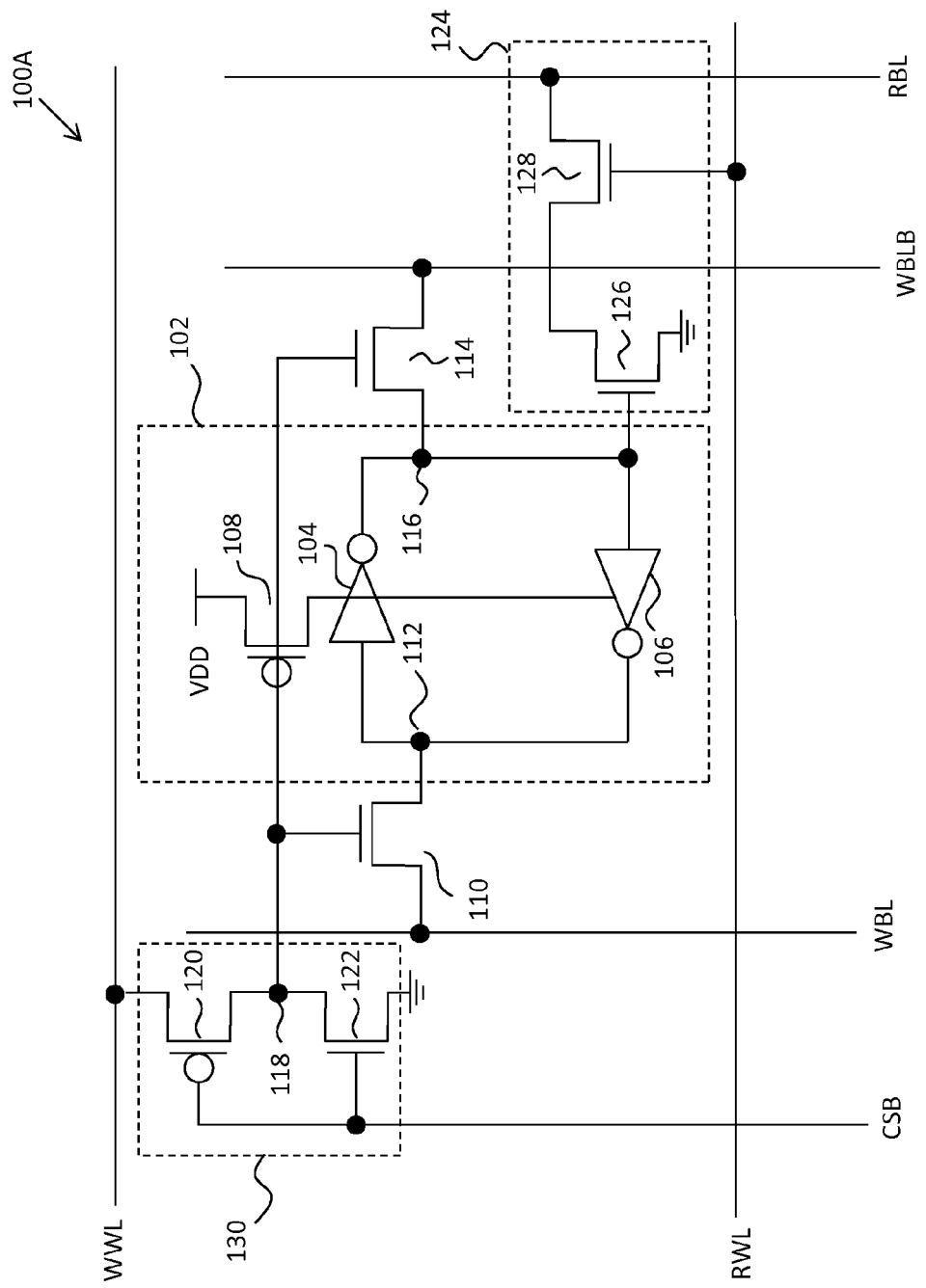
FIG. 1A is a circuit diagram of one example of an improved single-ended semiconductor memory bit cell.
Figure 1B:
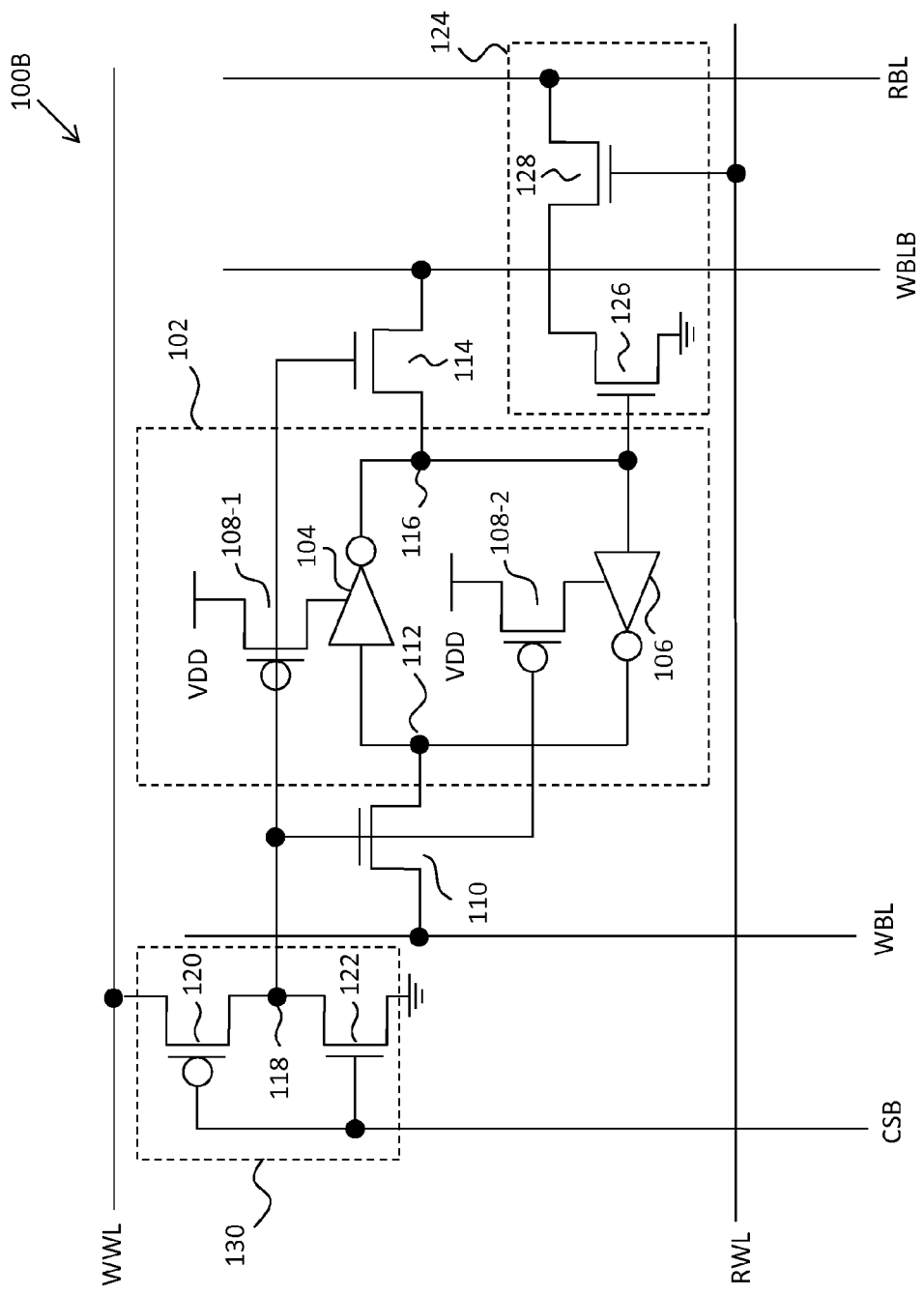
FIG. 1B is a circuit diagram of another example of an improved single-ended semiconductor memory bit cell.

FIGS. 1A and 1B respectively illustrate examples of improved single-ended bit cells 100A and 100B. As shown in FIGS. 1A and 1B, bit cells 100A and 100B include an inverter latch 102 for storing a data bit. Latch 102 includes a pair of cross-coupled inverters 104, 106, where each inverter 104, 106 may include a pair of complementary metal-oxide semiconductor ("CMOS") transistors.

In FIG. 1A, an embedded transistor 108 is coupled to inverters 104 and 106 for selectively coupling and decoupling the inverters 104, 106 to voltage supply rail VDD in order to improve writing data to latch 102. As shown in FIG. 1B, two embedded transistors 108-1 and 108-2 (collectively referred to as "embedded transistors 108") may be implemented with one embedded transistor 108-1 coupled to inverter 104 and the second embedded transistor 108-2 coupled to transistor 106. The embedded transistor(s) 108 may be p-type metal-oxide semiconductor field effect transistors ("PMOS") as shown in FIGS. 1A and 1B. In some embodiments, embedded transistor(s) may be n-type transistors (e.g., NMOS transistors) coupled to for selectively coupling the inverters 104, 106 of latch 102 to ground. One skilled in the art will understand that both NMOS and PMOS transistors may be included in order to completely decouple latch 102 from VDD and ground.

Latch 102 is coupled to a word bit line ("WBL") through transistor 110, which is coupled to storage node 112, and to a complementary word bit line ("WBLB") through transistor 114, which is coupled to storage node 116. Transistors 110, 114 may be NMOS transistors each having its respective gate coupled to node 118 disposed between transistors 120 and 122, which collectively define inverter 130. Transistor 120 may be a PMOS transistor having its source coupled to a write word line ("WWL"), its drain coupled to node 118, and its gate coupled to the column selection bar ("CSB") line. Transistor 122 may be an NMOS transistor having its drain coupled to node 118, its gate coupled to the CSB line, and its source coupled to ground.

Bit cell 100 also includes a read port 124 including a pair of transistors 126 and 128. Transistor 126 is a read pull down transistor having its gate coupled to node 116, its drain coupled to ground, and its source coupled to the drain of read pass gate transistor 128. Transistor 128 has its source coupled to the read bit line ("RBL") and its gate coupled to the read word line ("RWL").

Figure 1C:
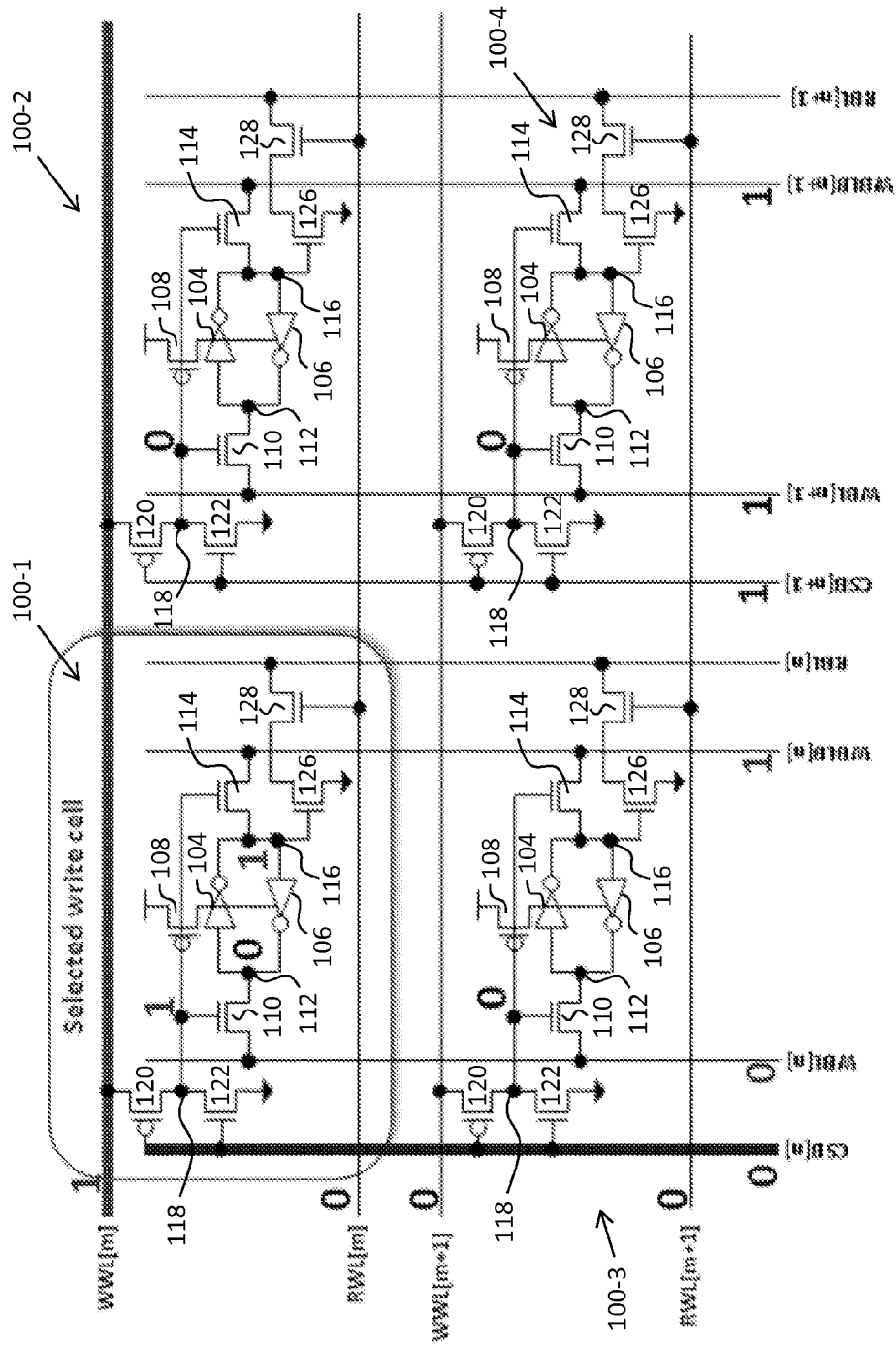
FIG. 1C is a circuit diagram illustrating a plurality of single-ended memory bit cells in accordance with FIG. 1A when a logic one is being written to a bit cell.

A writing of a logic one to storage node 116 of latch 100-1 in FIG. 1C is described with reference to FIG. 2A, which is a flow diagram of one example of a method 200 of writing a logic one to a memory bit cell. At block 202, a logic one is output to the WWL for the row in which bit cell is disposed to which the logic one is to be written, i.e., WWL[m], and RWLs are set to a logic zero to turn off transistor 128. A logic zero is output to line CSB for the column in which the bit cell is disposed to which the logic one is to be written, i.e., CSB[n], at block 204. The CSBs in the other columns, e.g., CSB[n+1], are set at logic ones.

With a logic zero on line CSB[n] and a logic one on WWL [m], transistor 120 of bit cell 100-1 is in an 'on' or current-conducting state such that current flows between the source and drain of transistor 120. The voltage on WWL[m] develops on node 118 of bit cell 100-1 due to the current flowing through transistor 120. Conversely, transistor 122 is 'off' or in a non-current-conducting state when CSB[n], which is coupled to the gate of transistor 122 of bit cell 100-1, is a logic zero and the voltage at node 118 is high or a logic one. The voltage of node 118 of bit cell 100-1 is coupled to the gate of transistors 110, 108, and 114

At block 206, a logic zero is output on line WBL[n], and a logic one is output on line WBLB[n]. Logic ones are output to the WBLs and WBLBs in the columns to which data is not being written, e.g., WBL[n+1] and WBLB[n+1]. At block 208, the logic zero on line WBL[n], in combination with the logic one on node 118 of bit cell 100-1, turns on transistor 110 such that a logic zero is written to node 112 of latch 102 in bit cell 100-1 while the logic one at node 118 turns off transistor 108 resulting in latch 102 being decoupled from voltage source VDD. The logic zero is written to node 112 more easily than in conventional bit cells in which a latch is coupled to a power supply during the writing operation. Transistor 114 is in an off state when node 118 is a logic one and WBLB[n] is also at a logic one. With node 116 decoupled from WBLB[n] due to transistor 114 being off, the logic one at node 112 passes through inverter 104 of latch 102 resulting in a logic one being written to storage node 116.

Figure 1D:
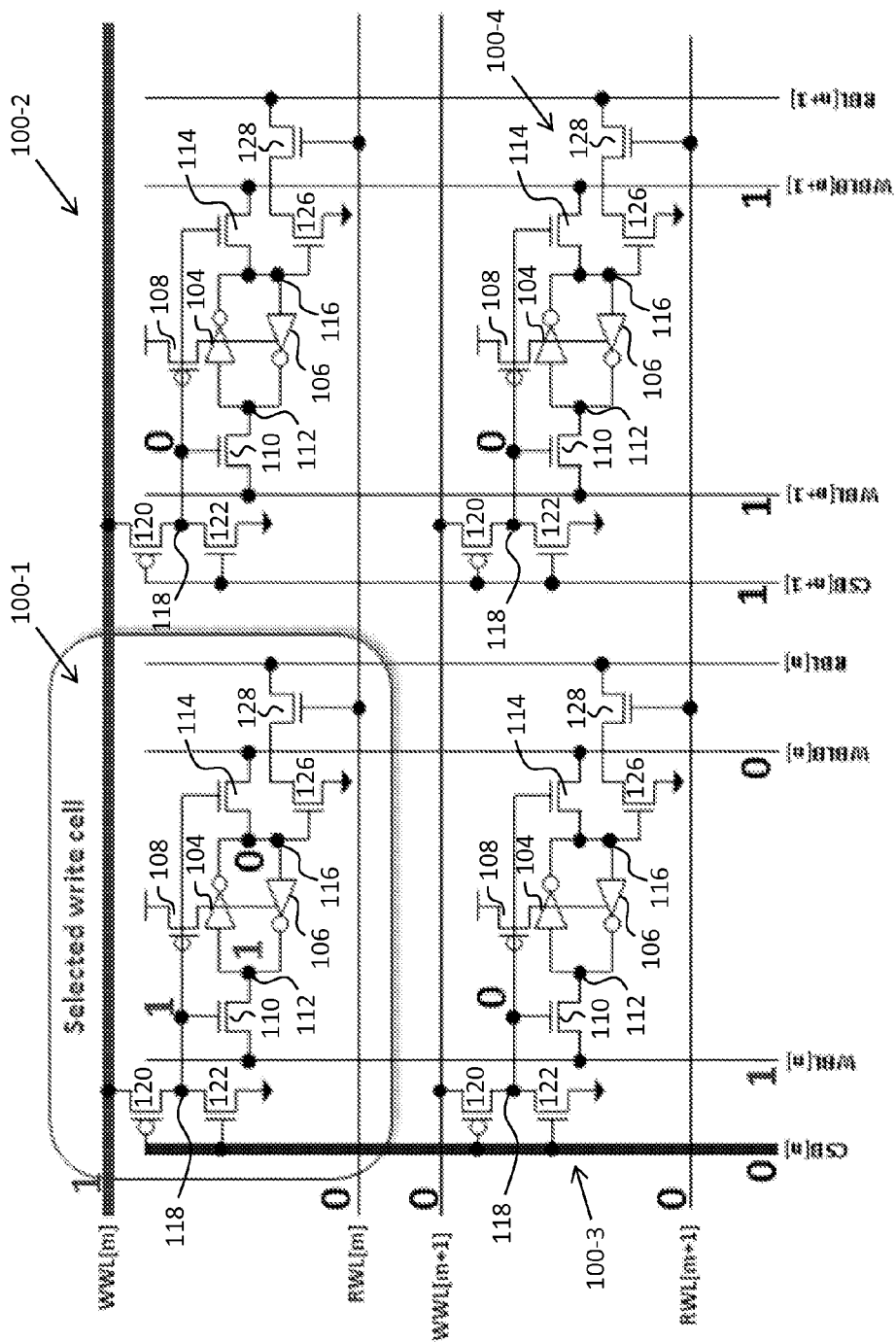
FIG. 1D is a circuit diagram illustrating a plurality of single-ended memory bit cells in accordance with FIG. 1A when a logic zero is being written to a bit cell.

A writing of a logic zero to storage node 116 of latch 100-1 in FIG. 1D is described with reference to FIG. 2B, which is a flow diagram of one example of a method 220 of writing a logic zero to a memory bit cell. At block 222, a logic one is output to the WWL for the row in which bit cell is disposed to which the logic one is to be written, i.e., WWL[m], and RWLs are set to a logic zero to turn off transistor 128. A logic zero is output to line CSB for the column in which the bit cell is disposed to which the logic one is to be written, i.e., CSB[n], at block 224. The CSBs in the other columns, e.g., CSB[n+1], are set at logic ones.

With a logic zero on line CSB[n] and a logic one on WWL [m], transistor 120 of bit cell 100-1 is in an 'on' or current-conducting state such that current flows between the source and drain of transistor 120. The voltage on WWL[m] develops on node 118 of bit cell 100-1 due to the current flowing through transistor 120. Conversely, transistor 122 is 'off' or in a non-current-conducting state when CSB[n], which is coupled to the gate of transistor 122 of bit cell 100-1, is a logic zero and the voltage at node 118 is high or a logic one. The voltage of node 118 of bit cell 100-1 is coupled to the gate of transistors 110, 108, and 114

At block 226, a logic one is output on line WBL[n], and a logic zero is output on line WBLB[n]. Logic ones are output to the WBLs and WBLBs in the columns to which data is not being written, e.g., WBL[n+1] and WBLB[n+1]. At block 228, the logic zero on line WBLB[n], in combination with the logic one on node 118 of bit cell 100-1, turns on transistor 114 such that a logic zero is written to node 116 of bit cell 100-1 while the logic one at node 118 turns off transistors 108 resulting in latch 102 being decoupled from voltage source VDD. The logic zero is written to node 116 more easily than in conventional bit cells in which a latch is coupled to a power supply during the writing operation. Transistor 110 is in an off state when node 118 is a logic one and WBL[n] is also at a logic one. With node 112 decoupled from WBL[n] due to transistor 110 being off, the logic one at node 116 passes through inverter 106 of latch 102 resulting in a logic one being written to storage node 112.

Figure 1E:
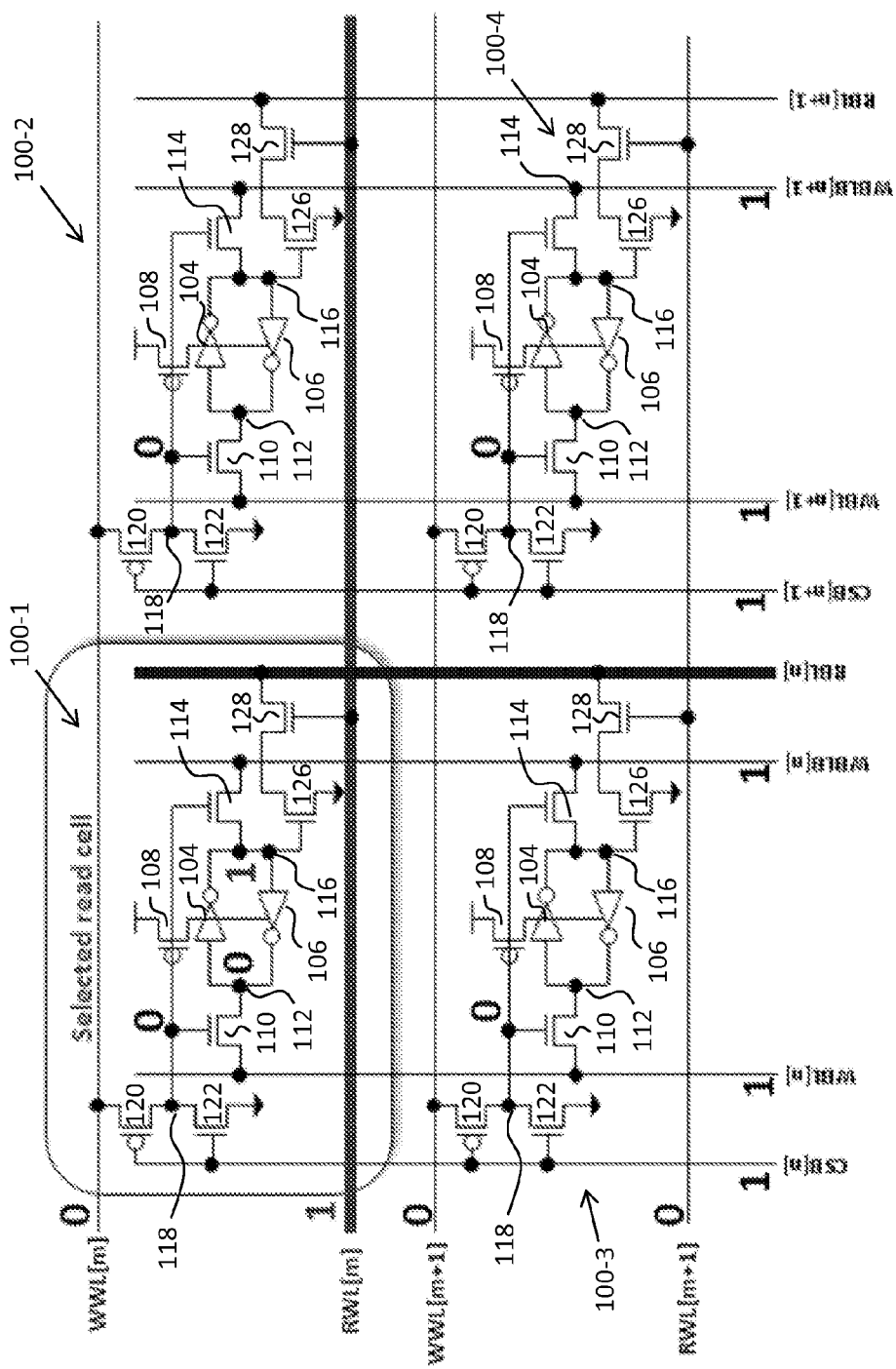
FIG. 1E is a circuit diagram illustrating a plurality of single-ended memory bit cells in accordance with FIG. 1A when a logic zero is being read from a bit cell.
Figures 2C, 2D:
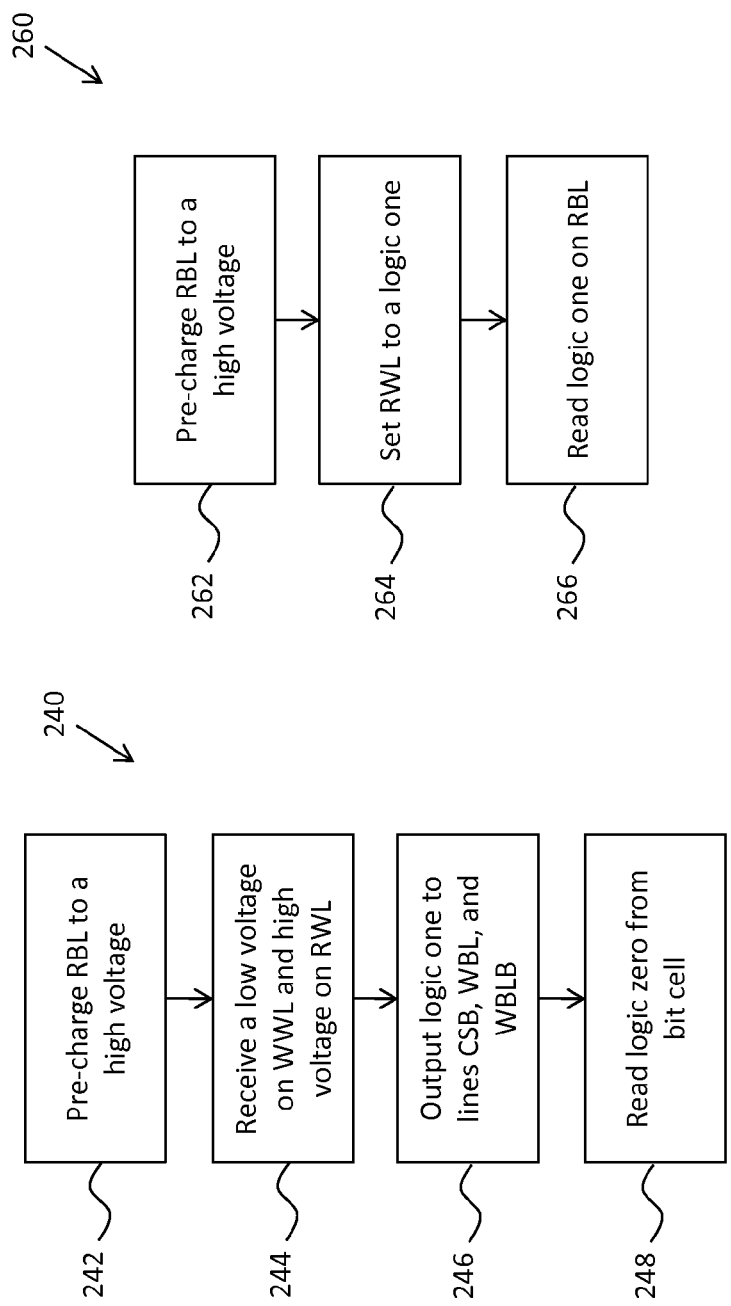
FIG. 2C is a flow diagram of the reading operation illustrated in FIG. 1E
FIG. 2D is a flow diagram of the reading operation illustrated in FIG. 1F.

The reading of a logic zero from bit cell 100-1 in FIG. 1E is described with reference to FIG. 2C, which is a flow diagram of one example of a method 240 of reading a logic zero from memory bit cell. At block 242, RBL is initially pre-charged to a high voltage. RWL is set to a high voltage and WWL is set to a low voltage in the row in which the bit cell from which data is to be read is disposed, e.g., RWL[m] and WWL[m] at block 244. The logic one on RWL[m] turns on transistor 128.

At block 246, a logic one is output to lines CSB, WBL, and WBLB in each of the columns of the semiconductor memory. The logic one on line CSB in combination with the low voltage on WWL turns off transistors 120 and turns on transistors 122. With transistors 120 off and transistors 122 on, node 118 is pulled low. The low voltage at node 118 of bit cell 100-1 in combination with the high voltage levels on lines WBL[n] and WBLB[n] turns off transistors 110 and 114 to isolate bit cell 100-1 and to prevent half-read disturbance. Transistor 108, which has its gate coupled to node 118 and its source coupled to VDD, is turned on to couple bit cell 100-1 to voltage supply VDD.

At block 248, the voltage stored at storage node 116 of bit cell 100-1 turns on transistor 126, which is coupled to RBL[n] through transistor 128. With transistors 126 and 128 on, RBL [n] is coupled to ground to read a zero from bit cell 100-1.

Figure 1F:
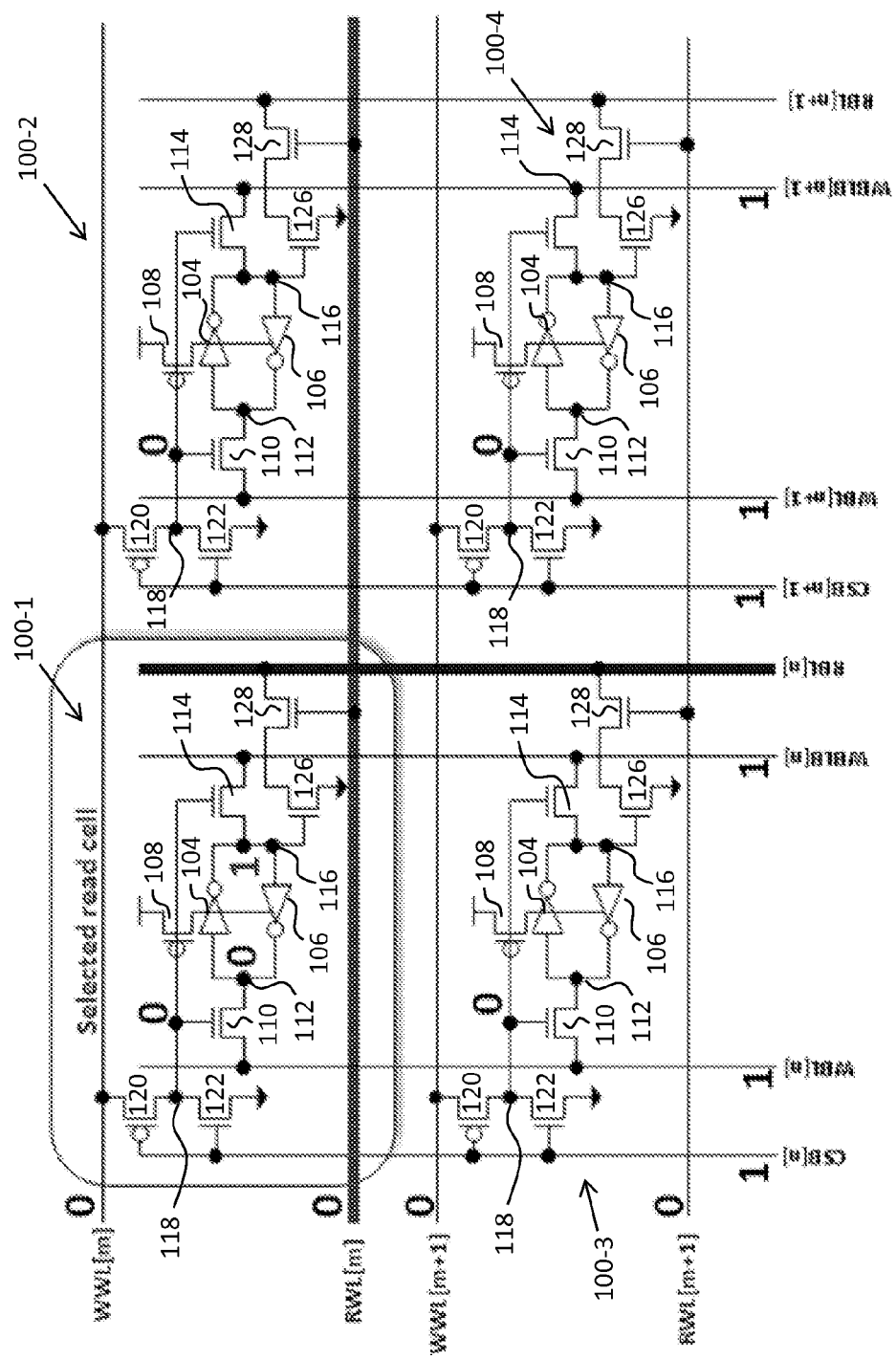
FIG. 1F is a circuit diagram illustrating a plurality of single-ended memory bit cells in accordance with FIG. 1A when a logic one is being read from a bit cell.

The reading of a logic one from bit cell 100-1 in FIG. 1F is described with reference to FIG. 2D, which is a flow diagram of one example of a method 260 of reading a logic zero from memory bit cell. At block 260, the RBL is pre-charged to a high voltage. With the RBL pre-charged to a logic one, a logic one may be output on the RWL at block 264, and the data on the RBL may be read at block 266. In some embodiments, the RWL may be remain low, i.e., step 264 may be skipped, and the logic RBL may be read out.

Figure 3A:
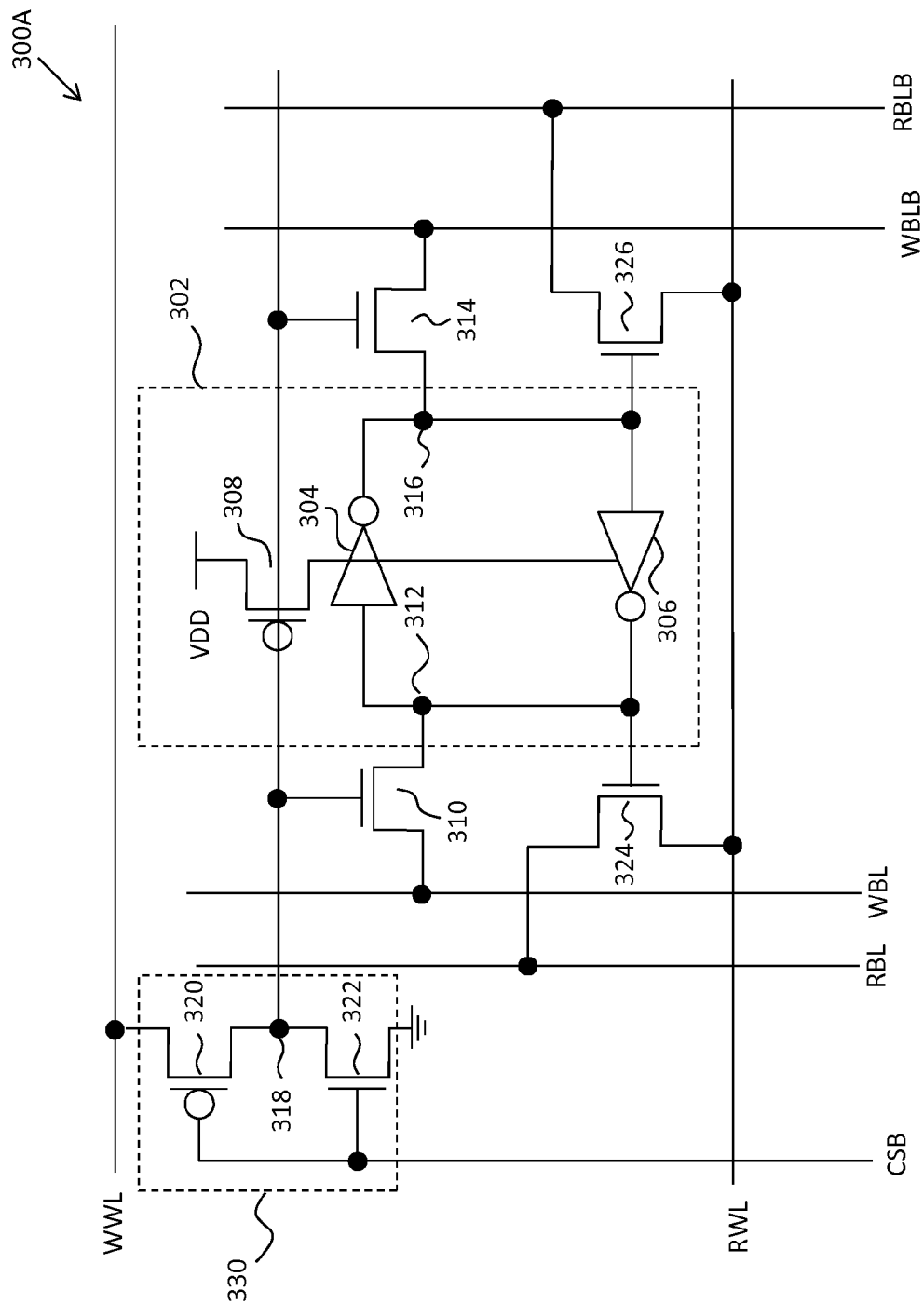
FIG. 3A is a circuit diagram of one example of an improved differential semiconductor memory bit cell.
Figure 3B:
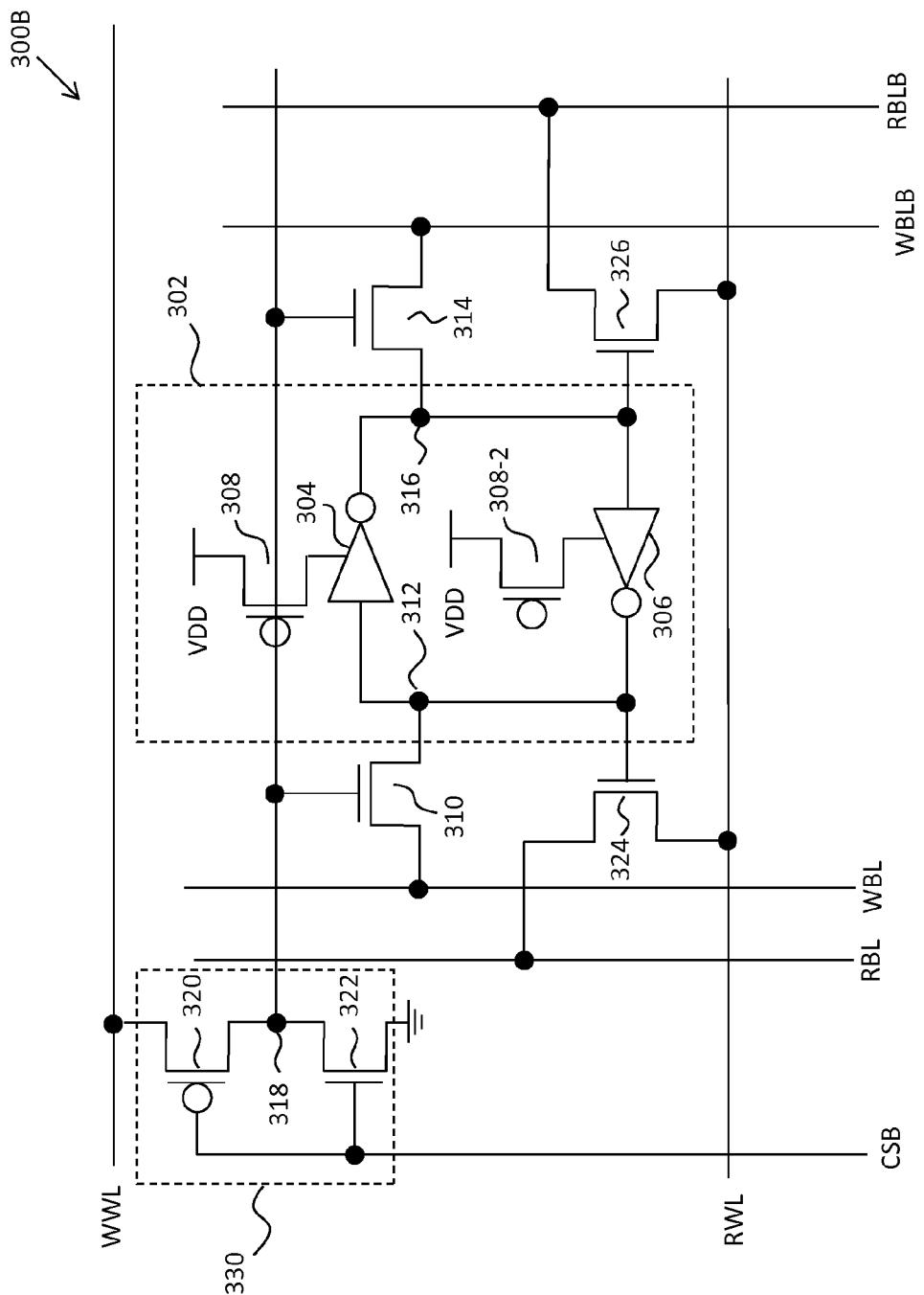
FIG. 3B is a circuit diagram of another example of an improved differential semiconductor memory bit cell.

The improved bit cells described above may also be implemented in for differential sensing, such as bit cells 300A and 300B respectively illustrated in FIGS. 3A and 3B. As shown in FIGS. 3A and 3B, differential bit cells 300A and 300B include a latch 302 formed by a pair of cross-coupled inverters 304 and 306. As described above with respect to inverters 104 and 106, each of inverters 304 and 306 may include an NMOS and a PMOS transistor.

Bit cells 300A and 300B also include one or more embedded transistors 308 coupled to latch 302. As shown in FIG. 3A, embedded transistor 308 is coupled between supply rail VDD and inverters 304 and 306. FIG. 3B illustrates an embodiment in which two embedded transistor 308-1, 308-1 (collectively referred to as "embedded transistors 308") are implemented. Embedded transistor 308-1 is coupled between power supply rail VDD and inverter 304, and embedded transistor 308-2 is coupled between voltage supply rail VDD and inverter 306. The embedded transistor(s) 308 may PMOS transistors as shown in FIGS. 3A and 3B or NMOS transistors coupled between an inverter and ground. One skilled in the art will understand that both NMOS and PMOS transistors may be implemented in order to completely decouple latch 302 from VDD and ground.

Transistor 310 is coupled to storage node 312 of latch 302 and to WBL, and transistor 314 is coupled to node storage 316 of latch 302 and to WBLB. The gates of transistors 310 and 314 are coupled to node 318, which is disposed between transistors 320 and 322. Transistors 320 and 322 collectively define inverter 330. Transistor 320 may be a PMOS transistor having its source coupled to WWL, its drain coupled to node 318, and its gate coupled to line CSB. Transistor 322 may be an NMOS transistor having its drain coupled to node 318, its gate coupled to the CSB line, and its source coupled to ground.

Transistors 324 and 326 both have their respective gates coupled to storage nodes 312 and 316 of latch 302 and provide a dedicated read port. Additionally, transistor 324 has its source connected to RBL and its drain coupled to RWL, and transistor 326 has its source connected to RBLB, which is the complementary RBL, and its drain coupled to RWLB, which is the complementary RWL.

FIGS. 4A and 4B illustrate improved dual-rail word-line drivers 400A and 400B that minimize current crowding in the read ports of differential bit cells 300A and 300B. As shown in FIG. 4A, word line driver 400A includes a logic gate 402, which may be a NAND gate having a first input configured to receive an enable signal, EN, and a second input configured to receive a clock signal, CLK. As will be understood by one skilled in the art, logic gate 402 may be implemented as other logic gates including, but not limited to, an AND gate, a NOR gate, an OR gate, and an XOR gate, to list a few possibilities. The output of logic gate 402 is coupled to the gates of PMOS transistor 404 and NMOS transistor 406. The source of PMOS transistor 404 is coupled to a boosted voltage source having a voltage that is greater than the voltage of voltage source VDD, i.e., VDD+ΔV, and the drain of PMOS transistor 404 is coupled to node 408. The source of NMOS transistor 406 is coupled to low voltage source rail VSS, and the drain of NMOS transistor 406 is coupled to node 408.

Node 408 serves as the output of the pre-driver inverter 416 formed by transistors 404 and 406 and is coupled to the gates of transistors 410 and 412. PMOS transistor 410 has its source coupled to supply line VDD and its drain coupled to node 414. NMOS transistor 412 has its gate coupled to low voltage supply VSS and its drain coupled to node 414, which serves as the output of the driver inverter 418 formed by transistors 410 and 412. Coupling the source of PMOS transistor 404 to a supply line having a voltage that is greater than the voltage of VDD increases the gate to source voltage, $V_{GS}$, of NMOS transistor 412, which enables faster turning on of transistor 412.

Word line driver 400B illustrated in FIG. 4B has a similar configuration to word line driver 400A illustrated in FIG. 4A except that the source of transistor 404 is coupled to supply line VDD and the source of NMOS transistor 412 is coupled to a voltage supply line having a voltage that is less than a voltage of VSS, i.e., VSS-ΔV. Coupling the source of NMOS transistor 412 of the driving inverter 418 formed by transistors 410 and 412 to a voltage source having a voltage level that is less than VSS increases the $V_{GS}$ of NMOS transistor 412, which enables faster turning on of transistor 412.

A writing of a logic one to storage node 316 of latch 302 in FIG. 3B is described with reference to FIG. 5A, which is a flow diagram of one example of a method 500 of writing a logic one to a memory bit cell. At block 502, a logic one is output to the WWL for the row in which bit cell is disposed to which the logic one is to be written, and RWL is set maintain at a logic one after pre-charging such that read port transistors 324 and 326 remain off A logic zero is output to line CSB for the column in which the bit cell is disposed to which the logic one is to be written, at block 504.

With a logic zero on line CSB and a logic one on WWL, transistor 320 is in an on state such that current flows between the source and drain of transistor 320. The voltage on WWL develops on node 318 due to the current flowing through transistor 320. Conversely, transistor 322 is off when CSB, which is coupled to the gate of transistor 322, is a logic zero and the voltage at node 318 is high. The voltage of node 318 is coupled to the gate of transistors 310, 308, and 314

At block 506, a logic zero is output on line WBL, and a logic one is output on line WBLB. At block 508, the logic zero on line WBL, in combination with the logic one on node 518, turns on transistor 310 such that a logic zero is written to node 312 of latch 302 while the logic one at node 318 turns off transistor 308 resulting in latch 302 being decoupled from voltage source VDD. The logic zero is written to node 312 more easily than in conventional bit cells in which a latch is coupled to a power supply during the writing operation. Transistor 314 is in an off state when node 318 and line WBLB are logic ones. With node 316 decoupled from WBLB due to transistor 314 being off, the logic one at node 312 passes through inverter 304 resulting in a logic one being written to storage node 316.

A writing of a logic zero to storage node 316 of latch 302 in FIG. 3A is described with reference to FIG. 5B, which is a flow diagram of one example of a method 520 of writing a logic zero to a memory bit cell. At block 522, a logic one is output to the WWL, and RWL is maintained at a logic one after pre-charging to maintain transistors 324 and 326 in an off state.

A logic zero is output to line CSB at block 524. With a logic zero on line CSB and a logic one on WWL, transistor 320 is in an on state such that current flows between the source and drain of transistor 320. The voltage on WWL develops on node 318 due to the current flowing through transistor 320. Conversely, transistor 322 is 'off' or in a non-current-conducting state when CSB, which is coupled to the gate of transistor 322, is a logic zero and the voltage at node 318 is a high voltage, e.g., VDD. The voltage of node 318 is coupled to the gate of transistors 310, 308, and 314

At block 526, a logic one is output to line WBL, and a logic zero is output on line WBLB. At block 528, the logic zero on line WBLB, in combination with the logic one on node 318, turns on transistor 314 such that a logic zero is written to node 316. The logic one at node 318 turns off transistors 308 resulting in latch 302 being decoupled from voltage source VDD. The logic zero is written to node 316 faster than in conventional bit cells in which a latch is coupled to a power supply during the writing operation. Transistor 310 is in an off state when node 318 and WBL are logic ones. With node 312 decoupled from WBL due to transistor 310 being off, the logic one at node 316 passes through inverter 306 of latch 302 resulting in a logic one being written to storage node 312.

A writing of a logic one to storage node 316 of latch 302 in FIG. 3B is described with reference to FIG. 5A, which is a flow diagram of one example of a method 500 of writing a logic one to a memory bit cell. At block 502, a logic one is output to the WWL for the row in which bit cell is disposed to which the logic one is to be written, and RWL is set maintain at a logic one after pre-charging such that read port transistors 324 and 326 remain off. A logic zero is output to line CSB for the column in which the bit cell is disposed to which the logic one is to be written, at block 504.

With a logic zero on line CSB and a logic one on WWL, transistor 320 is in an on state such that current flows between the source and drain of transistor 320. The voltage on WWL develops on node 318 due to the current flowing through transistor 320. Conversely, transistor 322 is off when CSB, which is coupled to the gate of transistor 322, is a logic zero and the voltage at node 318 is high. The voltage of node 318 is coupled to the gate of transistors 310, 308, and 314

At block 506, a logic zero is output on line WBL, and a logic one is output on line WBLB. At block 508, the logic zero on line WBL, in combination with the logic one on node 518, turns on transistor 310 such that a logic zero is written to node 312 of latch 302 while the logic one at node 318 turns off transistor 308 resulting in latch 302 being decoupled from voltage source VDD. The logic zero is written to node 312 more easily than in conventional bit cells in which a latch is coupled to a power supply during the writing operation. Transistor 314 is in an off state when node 318 and line WBLB are logic ones. With node 316 decoupled from WBLB due to transistor 314 being off, the logic one at node 312 passes through inverter 304 resulting in a logic one being written to storage node 316.

Figures 5C, 5D:
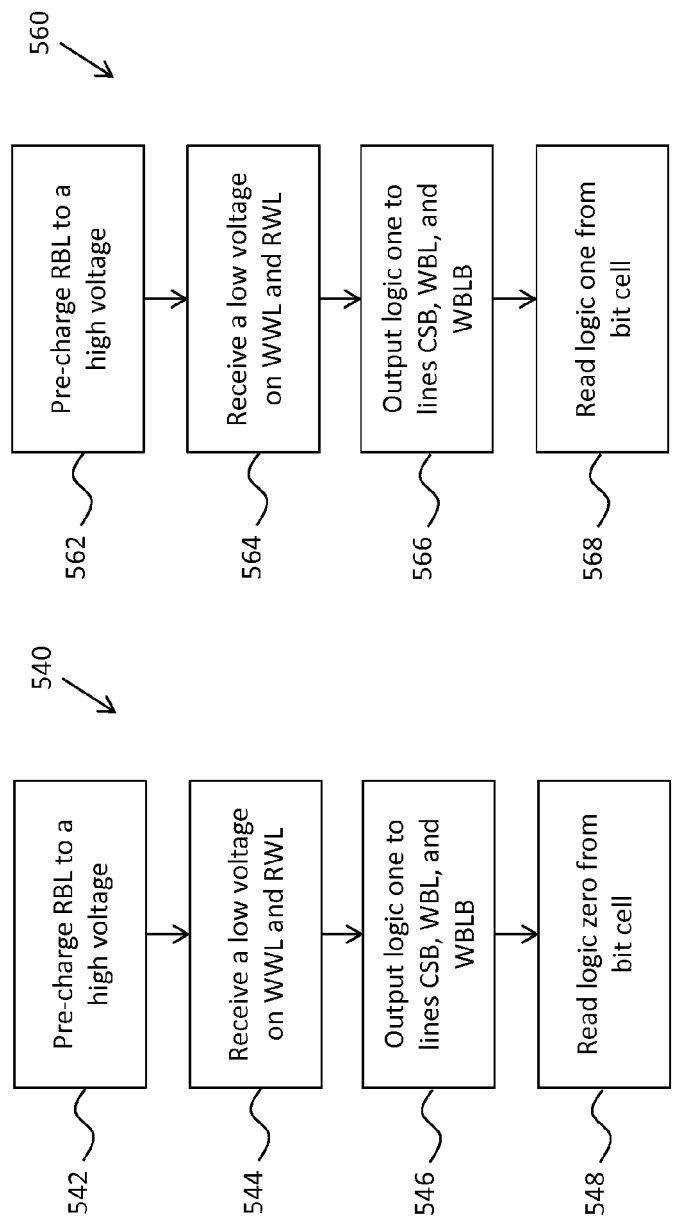
FIG. 5C is a flow diagram of one example of reading a logic zero from a differential bit cell in accordance with the bit cell illustrated in FIG. 3A.
FIG. 5D is a flow diagram of one example of reading a logic one from a differential bit cell in accordance with the bit cell illustrated in FIG. 3A.

The reading of a logic zero from bit cell 302 in FIG. 3A is described with reference to FIG. 5C, which is a flow diagram of one example of a method 240 of reading a logic zero from memory bit cell. At block 542, RBL is initially pre-charged to a high voltage. WWL is driven to a low voltage as is and RWL at block 566.

RWL is driven to a low voltage by a RWL driver, such as RWL driver 400A or 400B in FIGS. 4A and 4B, for example, logic gate 402 of RWL driver 400A outputs a logic zero in response to receiving logic ones at its inputs, i.e., from EN and CLK. The logic zero is inverted by the inverter formed by transistors 404 and 406 such that node 408 is coupled to a voltage source having a voltage of VDD+ΔV. The voltage at node 408 being greater than VDD turns on transistor 412 of the inverter formed by transistors 410 and 412 such that output node 414 is driven to a logic zero. The increased voltage of VDD+ΔV being output to node 408 results in NMOS 412 turning on more quickly than if NMOS transistor 412 received VDD at its gate.

In embodiments in which RWL driver 400B is coupled to RWL, logic gate 402 outputs a logic zero in response to receiving logic ones at its inputs, i.e., from EN and CLK. The logic zero is inverted by the inverter formed by transistors 404 and 406 such that node 408 is coupled to a voltage source having a voltage of VDD. The inverter formed by transistors 410 and 412 outputs a logic zero to the RWL in response to node 418 outputting a logic one. The voltage source coupled to NMOS transistor 412 having a voltage that is less than a voltage of VSS results in transistor 412 turning on more quickly than if NMOS transistor was coupled to VSS at its source.

At block 546, a logic one is output to lines CSB, WBL, and WBLB. The logic one on line CSB in combination with the low voltage on WWL turns off transistor 320 and turns on transistor 322. With transistor 320 off and transistor 322 on, node 318 is pulled low. The low voltage at node 318 in combination with the high voltage levels on lines WBL and WBLB turns off transistors 310 and 314 to isolate latch 302 and prevent half-read disturbance. Transistor 308, which has its gate coupled to node 1318 and its source coupled to VDD, is turned on to couple latch 302 to voltage supply VDD.

At block 548, the logic one stored at storage node 316 turns on transistor 326, which is coupled to RWL and RBLB. With transistor 326 on, RBL is coupled to RWL, which is set a low voltage, such that a logic zero is read out to RBLB.

The reading of a logic one from bit cell 300A in FIG. 3A is described with reference to FIG. 5D, which is a flow diagram of one example of a method 560 of reading a logic one from a differential memory bit cell. At block 562, RBL is initially pre-charged to a high voltage. WWL is driven to a low voltage as is and RWL at block 566. As described above, RWL is driven to a low voltage by a RWL driver, such as RWL driver 400A or 400B in FIGS. 4A and 4B, For example, logic gate 402 of RWL driver 400A outputs a logic zero in response to receiving logic ones at its inputs, i.e., from EN and CLK. The logic zero is inverted by the inverter formed by transistors 404 and 406 such that node 408 is coupled to a voltage source having a voltage of VDD+ΔV. The voltage at node 408 being greater than VDD turns on transistor 412 of the inverter formed by transistors 410 and 412 such that output node 414 is driven to a logic zero. The increased voltage of VDD+ΔV being output to node 408 results in NMOS 412 turning on more quickly than if NMOS transistor 412 received VDD at its gate.

In embodiments in which RWL driver 400B is coupled to RWL, logic gate 402 outputs a logic zero in response to receiving logic ones at its inputs, i.e., from EN and CLK. The logic zero is inverted by the inverter formed by transistors 404 and 406 such that node 408 is coupled to a voltage source having a voltage of VDD. The inverter formed by transistors 410 and 412 outputs a logic zero to the RWL in response to node 418 outputting a logic one. The voltage source coupled to NMOS transistor 412 having a voltage that is less than a voltage of VSS results in transistor 412 turning on more quickly than if NMOS transistor was coupled to VSS at its source.

At block 546, a logic one is output to lines CSB, WBL, and WBLB. The logic one on line CSB in combination with the low voltage on WWL turns off transistor 320 and turns on transistor 322. With transistor 320 off and transistor 322 on, node 318 is pulled low. The low voltage at node 318 in combination with the high voltage levels on lines WBL and WBLB turns off transistors 310 and 314 to isolate latch 302 and prevent half-read disturbance. Transistor 308, which has its gate coupled to node 1318 and its source coupled to VDD, is turned on to couple latch 302 to voltage supply VDD.

At block 548, the logic one stored at storage node 316 turns on transistor 326, which is coupled to RWL and RBLB. With transistor 326 on, RBL is coupled to RWL, which is set a low voltage, such that a logic zero is read out to RBL, which results in a logic one on line RBLB.

In some embodiments, a semiconductor memory includes a memory bit cell having a first storage node coupled to an input of a first inverter and to an output of a second inverter. A second storage node is coupled to an output of the first inverter and to an input of the second inverter. A first transistor is coupled to the first storage node and to a first write bit line. A second transistor is coupled to the second storage node and to a second write bit line. A third transistor has a source coupled to a first voltage supply and to the first inverter. A fourth transistor has a drain coupled to a second voltage source, a gate coupled to a first control line, and a source coupled to a first node. A third inverter has an input coupled to a first control line and an output coupled to the gates of the first, second, and third transistors. A read port is coupled to a first read bit line and to the second storage node.

In some embodiments, a semiconductor memory includes a memory bit cell having first and cross-coupled inverters forming a latch. First and second transistors are respectively coupled to first and second storage nodes of the latch and to first and second write bit lines. Each of the first and second transistors has a respective gate coupled to a first node. Third and fourth transistors are coupled together in series at the first node and are disposed between a write word line and a first voltage source. Each of the first and second transistors has a respective gate coupled to a first control line. A fifth transistor has a source coupled to a second voltage source, a drain coupled to at least one of the inverters of the latch, and a gate coupled to the first node. A read port is coupled to a first read bit line and to the second storage node of the latch.

The improved single-ended and differential semiconductor memories disclosed herein advantageously reduce and/or eliminate half-selected read line disturbance while providing improved read and write margins. The improved read and write margins advantageously increase the performance of the semiconductor memories such that faster read and write times are achieved.

Although the disclosed systems and methods have been described in terms of exemplary embodiments, they are not limited thereto. Rather, the appended claims should be construed broadly, to include other variants and embodiments of the systems and methods, which may be made by those skilled in the art without departing from the scope and range of equivalents of the systems and methods.

What is claimed is:

1. A semiconductor memory, comprising:
    a memory bit cell including:
        a first storage node coupled to an input of a first inverter and to an output of a second inverter;
        a second storage node coupled to an output of the first inverter and to an input of the second inverter;
        a first transistor coupled to the first storage node and to a first write bit line;
        a second transistor coupled to the second storage node and to a second write bit line;
        a third transistor having a source coupled to a first voltage supply and to the first inverter;
        a fourth transistor having a drain coupled to a second voltage source, a gate coupled to a first control line, and a source coupled to a first node;
        a third inverter having an input coupled to a first control line and an output coupled to the gates of the first, second, and third transistors; and
        a read port coupled to a first read bit line and to the second storage node.

2. The semiconductor memory of claim 1, wherein the third inverter includes
    a fifth transistor having a source coupled to a write word line, a drain coupled to the first node, and a gate coupled to the first control line, and
    a sixth transistor having a source coupled to a second power supply, a drain coupled to the first node, and a gate coupled to the first control line.

3. The semiconductor memory of claim 1, wherein the read port includes
    a fifth transistor having a gate coupled to a read word line and a drain coupled to the first read bit line, and
    a sixth transistor having a gate coupled to the second storage node, a source coupled to the second voltage supply, and a drain coupled to the source of the fifth transistor.

4. The semiconductor memory of claim 1, wherein the memory bit cell includes a fifth transistor coupled to the first voltage supply and to the second inverter.

5. The semiconductor memory of claim 1, wherein the memory bit cell includes a second read port coupled to the first storage node and to a second read bit line.

6. The semiconductor memory of claim 5, wherein
    the first read port includes a fifth transistor having a gate coupled to the second storage node, a drain coupled to the first read bit line, and a source coupled to a read word line, and
    the second read port includes a sixth transistor having a gate coupled to the first storage node, a drain coupled to a second read bit line, and a source coupled to the read word line.

7. The semiconductor memory of claim 6, further comprising:
    a read word line driver coupled to the read word line, the read word line driving including
        a first logic gate having a first input configured to receive a control signal and an second input configured to receive a clock signal,
        a fourth inverter having an input coupled to an output of the first logic gate, the fourth inverter configured to output one of a voltage approximately equal to a voltage of the second voltage source or a voltage greater than a voltage of the first voltage source in response to receiving an output from the first logic gate, and
        a fifth inverter having an input coupled to an output of the fourth inverter and an output coupled to the read word line,
    wherein the first voltage source has a voltage that is higher than the voltage of the second voltage source.

8. The semiconductor memory of claim 7, further comprising:
    a read word line driver coupled to the read word line, the read word line driving including
        a first logic gate having a first input configured to receive a control signal and an second input configured to receive a clock signal,
        a fourth inverter having an input coupled to an output of the first logic gate, and
        a fifth inverter having an input coupled to an output of the fourth inverter and an output coupled to the read word line, the fifth inverter configured to output a voltage approximately equal to a voltage of the first voltage source or a voltage less than a voltage of the second voltage source in response to receiving an output signal from the fourth inverter,
    wherein the first voltage source has a voltage that is higher than the voltage of the second voltage source.

9. A semiconductor memory, comprising:
    a memory bit cell including:
        first and second cross-coupled inverters forming a latch;
        first and second transistors respectively coupled to first and second storage nodes of the latch and respectively to first and second write bit lines, each of the first and second transistors having a respective gate coupled to a first node;
        third and fourth transistors coupled together in series at the first node and disposed between a write word line and a first voltage source, each of the first and second transistors having a respective gate coupled to a first control line;
        a fifth transistor having a source coupled to a second voltage source, a drain coupled to at least one of the inverters of the latch, and a gate coupled to the first node; and
        a read port coupled to a first read bit line and to the second storage node of the latch.

10. The semiconductor memory of claim 9, wherein the read port includes
    a sixth transistor having a gate coupled to a read word line and a drain coupled to the first read bit line, and
    a seventh transistor having a gate coupled to the second storage node of the latch, a source coupled to the first voltage supply, and a drain coupled to the source of the sixth transistor.

11. The semiconductor memory of claim 9, wherein the fifth transistor is coupled to both inverters of the latch.

12. The semiconductor memory of claim 9, wherein the fifth transistor is coupled to a first inverter of the latch and a sixth transistor is coupled to a second inverter of the latch and to the second voltage source.

13. The semiconductor memory of claim 9, wherein the bit cell includes a second read port coupled to the first storage node of the latch and to a second read bit line.

14. The semiconductor memory of claim 13, wherein
the first read port includes a sixth transistor having a gate coupled to the second storage node of the latch, a drain coupled to the first read bit line, and a source coupled to the read word line, and
the second port includes a seventh transistor having a gate coupled to the first storage node of the latch, a drain coupled to a second read bit line, and a source coupled to the read word line.

15. The semiconductor memory of claim 13, wherein the first and second read bit lines are complementary read bit lines, and the first and second write bit lines are complementary write bit lines.

16. The semiconductor memory of claim 13, wherein the fifth transistor is coupled to a first inverter of the latch and a sixth transistor is coupled to a second inverter of the latch and to the second voltage source.

17. The semiconductor memory of claim 14, further comprising:
a read word line driver coupled to the read word line, the read word line driving including
a first logic gate having a first input configured to receive a control signal and an second input configured to receive a clock signal,
a third inverter having an input coupled to an output of the first logic gate, the third inverter configured to output one of a voltage approximately equal to a voltage of the first voltage source or a voltage greater than a voltage of the second voltage source in response to receiving an output from the first logic gate, and
a fourth inverter having an input coupled to an output of the third inverter and an output coupled to the read word line,
wherein the second voltage source has a voltage that is higher than the voltage of the first voltage source.

18. The semiconductor memory of claim 17, wherein the second voltage source is one of ground or VSS and the first voltage source is VDD.

19. The semiconductor memory of claim 14, further comprising:
a read word line driver coupled to the read word line, the read word line driving including
a first logic gate having a first input configured to receive a control signal and an second input configured to receive a clock signal,
a third inverter having an input coupled to an output of the first logic gate, and
a fourth inverter having an input coupled to an output of the third inverter and an output coupled to the read word line, the fourth inverter configured to output one of a voltage approximately equal to a voltage of the second voltage source or a voltage less than a voltage of the first voltage source in response to receiving an output from the third inverter,
wherein the second voltage source has a voltage that is higher than the voltage of the first voltage source.

20. The semiconductor memory of claim 19, wherein the second voltage source is one of ground or VSS and the first voltage source is VDD.

\* \* \* \* \*